(12) United States Patent
Fujita et al.

(10) Patent No.: US 7,462,566 B2
(45) Date of Patent: Dec. 9, 2008

(54) METHOD FOR MANUFACTURING SEMICONDUCTOR DEVICE

(75) Inventors: Masato Fujita, Kanagawa (JP); Kensuke Taniguchi, Kanagawa (JP); Akira Mitsuiki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 209 days.

(21) Appl. No.: 11/600,071

(22) Filed: Nov. 16, 2006

(65) Prior Publication Data

US 2008/0085608 A1 Apr. 10, 2008

(30) Foreign Application Priority Data

Oct. 5, 2006 (JP) .............................. 2006-273865

(51) Int. Cl.
  *H01L 21/302* (2006.01)
(52) U.S. Cl. ............... 438/736; 438/706; 257/E21.232; 257/E21.222
(58) Field of Classification Search ................. 438/706, 438/736; 257/E21.222, E21.231, E21.232, 257/E21.246
See application file for complete search history.

(56) References Cited

U.S. PATENT DOCUMENTS

| 7,034,379 | B2 * | 4/2006 | Swanson et al. ............ 257/565 |
|---|---|---|---|
| 7,115,993 | B2 * | 10/2006 | Wetzel et al. ................ 257/758 |
| 7,169,708 | B2 * | 1/2007 | Inukai .......................... 438/700 |
| 7,259,089 | B2 * | 8/2007 | Kanamura ................... 438/623 |
| 7,407,851 | B2 * | 8/2008 | Miller et al. ................. 438/220 |
| 2002/0173163 | A1 * | 11/2002 | Gutsche ....................... 438/736 |
| 2006/0166482 | A1 * | 7/2006 | Kanamura ................... 438/623 |

FOREIGN PATENT DOCUMENTS

| JP | 2000-227652 | 8/2000 |
|---|---|---|
| JP | 2002-175981 | 6/2002 |
| JP | 2003-318128 | 11/2003 |
| JP | 2004-133384 | 4/2004 |
| JP | 2005-045176 | 2/2005 |
| JP | 2005-86119 | 3/2005 |

\* cited by examiner

*Primary Examiner*—Scott B Geyer
*Assistant Examiner*—Seahvosh J Nikmanesh
(74) *Attorney, Agent, or Firm*—Young & Thompson (57) ABSTRACT

In the process of forming a predetermined pattern in a process target film, a stacked hard mask film having a first film, a second film and a third film stacked in this order is formed on the process target film (S100), fine line patterns are formed in the third film through a fine-pattern-forming resist film while using the second film as an etching stopper (S102), and the fine-pattern-forming resist film is removed (S104). Subsequently, light exposure is carried out using a resist film (S106 to S110), and the second film, the first film and the process target film are then selectively dry-etched in a sequential manner, to thereby form the process target film into a predetermined pattern (S112). The first film remained on the process target film is then removed (S114).

9 Claims, 11 Drawing Sheets

METHOD FOR MANUFACTURING SEMICONDUCTOR DEVICE

This application is based on Japanese patent application No. 2006-273,865, the content of which is incorporated hereinto by reference.

BACKGROUND

1. Technical Field

The present invention relates to a method of manufacturing a semiconductor device.

2. Related Art

With further advancement in integration level and higher operation speed of devices, a demand has arisen in the lithographic process, in particular in a step of forming the gate pattern, with respect to formation of fine gate patterns far shorter than the wavelength of exposure light. With recent trends in higher integration levels, system LSIs tend to include more kinds of circuit patterns therein. If a mask (reticle) contains various circuit patterns, adoption of optical conditions for light exposure optimized to any one of the various patterns results in resolution failures in other patterns, due to optical characteristics degraded by proximity effects and so forth. The situation may induce abnormal geometrical failures such as increase of constriction, increase of dimensional variation, and interconnects line shorts.

There has been a well-known technique, OPC (optical proximity correction), modifying a mask pattern in order to obtain the designed pattern shape on a wafer, by taking such proximity effect into consideration. Increased complexity in the circuit pattern has, however, raised a problem of complicating the OPC, and of consequently increasing the operation load. Complicated circuit pattern has degraded the accuracy of correction, and resulting in the electrical characteristics of fabricated devices.

A technique using the Levenson-type phase shift mask (PSM) has been known as a method of forming fine patterns. The Levenson-type PSM is particularly excellent in effects of improving optical contrast and resolution performance, and is supposed to be an expectant technique of forming fine patterns equal to or smaller than half of the wavelength of exposure light. Phase shifters so as to change phase of transmitted light (through the phase shifters) by $\pi$ are disposed on the Levenson-type PSM. The light intensity becomes zero at the boundary between phase-shifter area and non-shifter area by complete canceling of positive-negative ($0-\pi$) photo-electric fields based on optical interference.

Patent Document 1 (Japanese Laid-Open Patent Publication No. 2005-86119) describes a method of forming a fine pattern, aimed at fabricating a photomask having a transmission portion and intercepting portion for light exposure onto a resist, the method including a step of extracting regions where line portions and contact portions in a pattern of a photomask pattern are adjacent to each other, and fabricating a first mask composed of the line portions and a second mask composed of the contact portions; a step of illuminating the resist through a first mask under a first illumination condition; and a step of illuminating the resist through a second mask under a second illumination condition. According to the description, dimensional errors of the finished resist pattern ascribable to the optical proximity effect can be reduced.

Patent Document 2 (Japanese Laid-Open Patent Publication No. 2000-227652) describes a method of forming a pattern using a phase shift mask, capable of preventing narrow-pitched pattern from being thinned.

[Patent Document 1] Japanese Laid-Open Patent Publication No. 2005-86119

[Patent Document 2] Japanese Laid-Open Patent Publication No. 2000-227652

SUMMARY OF THE INVENTION

The technique described in Patent Document 1, however, still remains a room of improvement, due to poor accuracy of formation of fine patterns. Use of different masks for the line portions and the contact portions has certainly been successful in reducing the dimensional errors in the resist mask, as compared with the case where both portions are formed using a single mask. However, even in this case, it is difficult to completely eliminate the dimensional errors. For this reason, the resist causes the dimensional errors such as corner rounding when illuminated through the first mask. If the resist in this state is illuminated through the second mask, a dimensional error relative to the second mask can occur, showing a larger tendency of occurrence of error at locations having the corner rounding and so forth previously occurred therein by the first exposure of light. In particular, regions where a plurality of patterns overlap and cross with each other are more likely to cause the dimensional errors. It has, therefore, been difficult to form the fine patterns in a precise manner. Also the method described in Patent Document 2 still remains in a problem, in view of accurately patterning the process target film without causing damages.

According to the present invention, there is provided a method of manufacturing a semiconductor device including a step of forming a predetermined pattern in a process target film formed on or over a semiconductor substrate, the method includes:

a step of forming, on the process target film, a stacked hard mask film having a first film, a second film and a third film stacked therein in this order;

a step of selectively dry-etching the third film through a first resist film having a first pattern used as a mask, while making use of the second film as an etching stopper, to thereby form the first pattern in the third film;

a step of removing the first resist film;

a step of forming, after removal of the first resist film, a second resist film having a second pattern on the stacked hard mask film and then selectively dry-etching the stacked hard mask film and the process target film in this order, while making use of the second resist film as a mask, to thereby form the process target film according to the predetermined pattern; and a step of removing, after formation of the process target film according to the predetermined pattern, the first film remained on the process target film.

According to these process steps, the process target film can be patterned with high accuracy, because it is processed according to a predetermined pattern by repeating the patterning multiple times using a plurality of resist films having different patterns. Another advantage is such that the first film is never damaged even when the first film is composed of a material susceptible to damages by ashing during removal of the resist film or by cleaning based on SPM ($H_2SO_4/H_2O_2$), because the first film is protected by the second film. Therefore, pattern geometry can accurately be transferred to the first film.

Carbon-base film such as amorphous carbon may be used for this sort of first film. When this sort of material is used, any exposure of the surface of the first film during removal of the resist film may result in thinning of the first film, with progress of removal of the resist film due to ashing and SPM cleaning. It is also anticipated that the first film composed of amorphous carbon, which shows large physical/chemical adsorption of acidic substances, may result in dimensional and geometrical abnormalities of the resist film, if the resist film is formed directly on the first film. However, the first film protected by the second film can be prevented from being damaged. The first film may not be restricted to the amorphous carbon film and may be composed of film other than the amorphous carbon film, so far as being readily removable by ashing without exerting any damages to the process target film, while serving as a mask for processing the process target film, wherein organic polymer films readily removable by ashing using oxygen-based gas ($O_2$ plasma ashing), such as resist film and polyimide film, and inorganic carbon film and so forth are applicable.

On the other hand, the first film composed of a carbon-base film can readily be removed typically by ashing. The first film can, therefore, be removed after the process target film is patterned, without exerting any damage to the process target film. As a consequence, the process target film can precisely be patterned.

The first resist film herein can be used for forming narrow line patterns out of the predetermined pattern. The second resist film can be used for trimming aimed at removing unnecessary portions of the narrow line patterns, and for forming wide line patterns and contact pad patterns out of the predetermined pattern.

The present invention can improve dimensional accuracy of the gate patterns of semiconductor devices.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described below, referring to the attached drawings. It is to be noted that any similar constituents will be given with same reference numerals in all drawings, so as to properly avoid repetitive explanations.

Figure 1A:
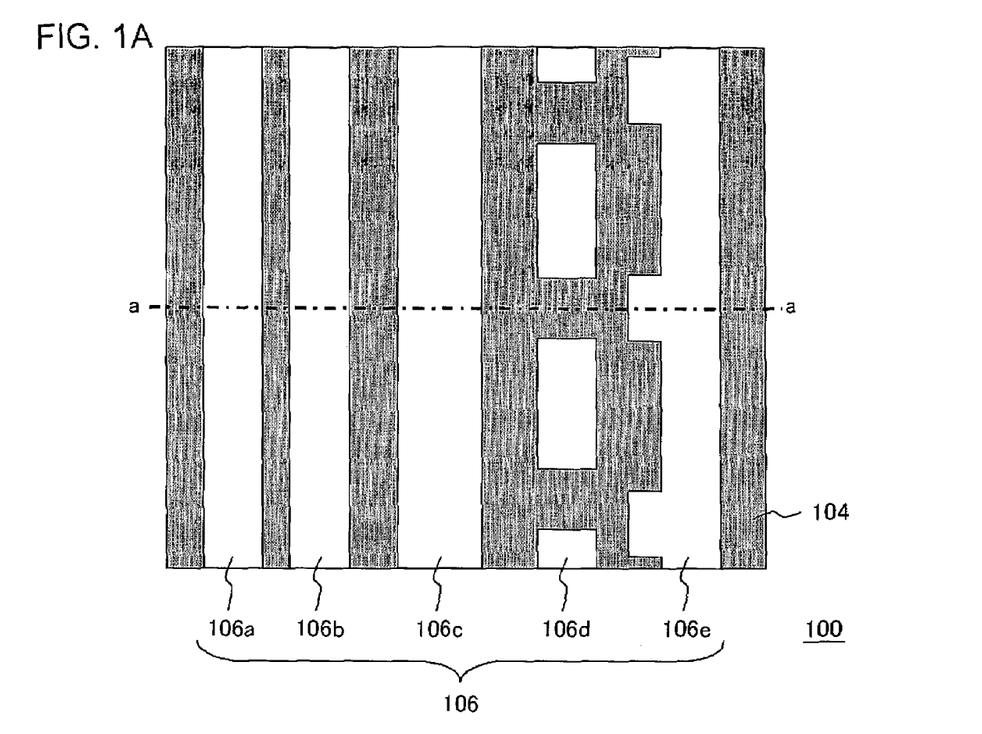
FIG. 1A and FIG. 1B are drawings showing a configuration of a semiconductor device manufactured by a method of manufacturing a semiconductor device according to an embodiment of the present invention.
Figure 1B:
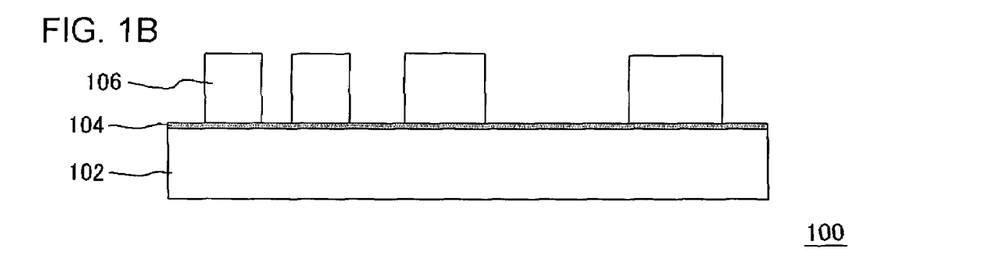

FIG. 1A and FIG. 1B are drawings showing a configuration of a semiconductor device 100 manufactured by a method of manufacturing a semiconductor device according to an embodiment of the present invention. FIG. 1A is a top view, and FIG. 1B is a sectional view taken along a-a in FIG. 1A.

The semiconductor device 100 includes a semiconductor substrate 102, a gate oxide film 104 formed thereon, and a polysilicon film 106 formed thereon. As shown in FIG. 1A, the polysilicon film 106 includes a narrow first line 106a and a second line 106b, a wide third line 106c, a narrow and partially-discontinuous fourth line 106d, and a narrow fifth line 106e containing contact pads. The first line 106a, the second line 106b, the third line 106c and the fourth line 106d are gate patterns, and the fifth line 106e is a gate pattern combined with contact pads.

Process steps of forming the pattern as shown in FIG. 1 in the polysilicon film 106 according to this embodiment will be described below. First, the pattern is classified into several categories based on the width, geometry and so forth. In this embodiment, the classification is made into narrow lines and the others. The other patterns include the third line 106c and the contact pads portions of the fifth line 106e. Next, photomasks (reticles) are prepared respectively for the categories, and the resist film is illuminated under optical conditions optimized for each of the photomasks, followed by development. A pattern having discontinuous portions such as the fourth line 106d can be formed by once forming a line, and then trim it so as to remove the portions to be discontinued. Therefore, also a photomask used for the trimming needs be prepared.

Thereafter, the pattern is formed according to the procedures below:

(1) the narrow line patterns are formed;

(2) unnecessary portions of the narrow line patterns are removed by trimming; and (3) the wide line pattern and the contact pads are formed.

Figure 2:
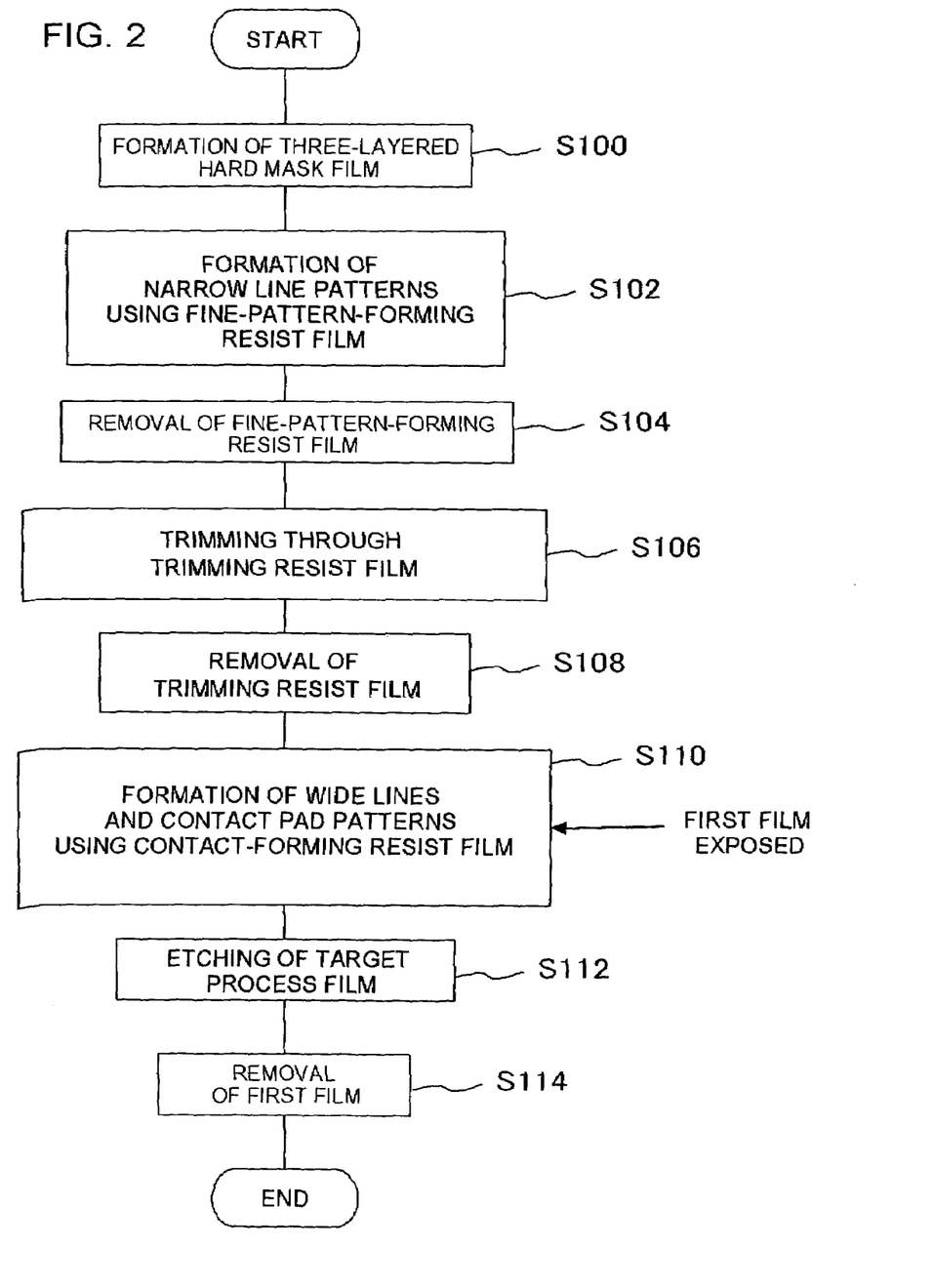
FIG. 2 is a flow chart showing procedures of patterning a polysilicon film of a semiconductor device according to an embodiment of the present invention.

FIG. 2 is a flow chart showing procedures of patterning the polysilicon film 106 of the semiconductor device 100 according to the embodiment of the present invention. In this invention, a hard mask film is formed on the polysilicon film 106 as the process target film, the pattern is transferred to the hard mask film, and the polysilicon film 106 is patterned by dry etching through the hard mask film used as a mask. In this embodiment, a three-layered hard mask film is used as the hard mask film. The three-layered hard mask film herein is composed of a material capable of ensuring an etching selectivity with respect to the upper and lower films in contact therewith. This configuration allows step-wise patterning of the individual layers.

First, the three-layered hard mask film (stacked hard mask film), having a first film, a second film and a third film stacked therein in this order, is formed on the polysilicon film 106 (S100). The first film, the second film and the third film herein are formed over the entire surface of the semiconductor substrate. In this embodiment, the first film can be composed of amorphous carbon.

Next, a resist film is formed on the third film, and the resist film is illuminated (first light exposure) through a photomask having a narrow line pattern (first pattern), followed by development, to thereby form a fine-pattern-forming resist film (first resist film) having the fine line patterns. Next, the third film is dry-etched through the fine-pattern-forming resist film used as a mask, while making use of the second film as an etching stopper film, to thereby form the narrow line patterns in the third film (S102). By these processes, the first line 106a, the second line 106b, the fourth line 106d (having no discontinuous portions), and the line portion of the fifth line 106e shown in FIG. 1A are formed. Next, the fine-pattern-forming resist film is removed typically by ashing (S104).

Thereafter, a resist film is formed on the second film and the third film, and the resist film is illuminated (second light exposure) through a photomask having a trimming pattern (third pattern) used for removing a part of the narrow line patterns formed in the third film, followed by development, to thereby form a trimming resist film (second resist film). The trimming pattern may be a pattern having the narrow line patterns formed in step S102, opened at the unnecessary portions thereof. Next, the third film is selectively dry-etched through the trimming resist film used as a mask, while making use of the second film as an etching stopper film, to thereby remove the unnecessary portions of the third film (S106). By these processes, the fourth line 106d having the discontinuous portions as shown in FIG. 1A is formed. The second resist film is then removed typically by ashing (S108). Up to this process step, the first film is protected by the second film.

Thereafter, a resist film is formed on the second film and the third film, and the resist film is then illuminated (third light exposure) through a photomask having a contact-forming pattern (second pattern), followed by development, to thereby form the contact-forming resist film (second resist film). The contact-forming pattern, in plan view, has regions which overlap or cross the narrow line patterns. The contact-forming pattern also has patterns of the wide line patterns and contact pads. The second film is then selectively dry-etched through the contact-forming resist film and the third film used as masks. This is the first time for the second film to be etched, and thereby the first film exposes out to the surface. Next, the first film and the process target film are selectively dry-etched in a sequential manner through the second film used as a mask. By these processes, the predetermined pattern is formed in the process target film (S110, S112).

Thereafter, the first film remaining on the process target film is removed (S114). In this embodiment, the first film composed of amorphous carbon can readily be removed typically by ashing.

As has been described in the above, according to the procedures of manufacturing the semiconductor device 100 in this embodiment, the first film composed of amorphous carbon does not expose to the surface during the patterning of the hard mask film, even if a need of removing the resist film arises, so that the first film can be protected without being damaged by ashing, or by cleaning using a chemical liquid such as $H_2SO_4$. By these processes, it is also made possible to finally remove the first film by ashing in a more easy manner.

Procedures of manufacturing the semiconductor device 100 in this embodiment will specifically be explained below, referring to FIG. 3A to FIG. 11B. In FIG. 3A to FIG. 11B, FIG. 3B to FIG. 11B are sectional views taken along a-a in FIG. 3A to FIG. 11A, respectively.

As shown in FIG. 3, a region to be patterned in this embodiment is divided into four areas. The narrow line patterns are formed in area "A", the wide line pattern is formed in area "B", the narrow line pattern is divided in area "C", and the narrow line pattern and the contact pads are formed in area "D".

Figure 3A:
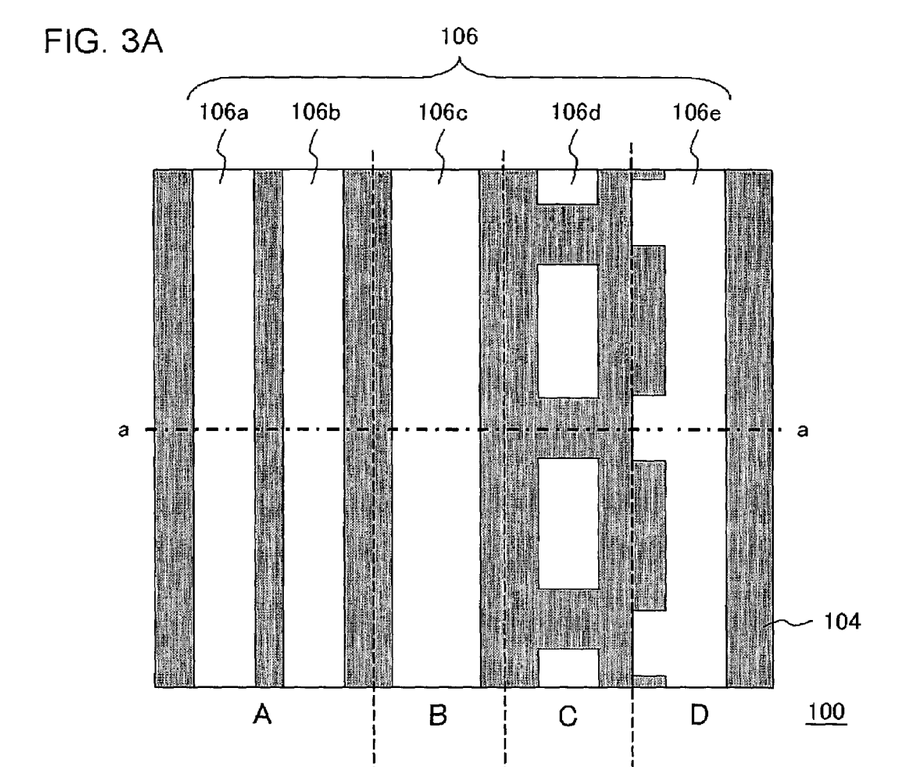
FIG. 3A and FIG. 3B are drawings explaining procedures of manufacturing a semiconductor device according to an embodiment of the present invention.
Figure 3B:
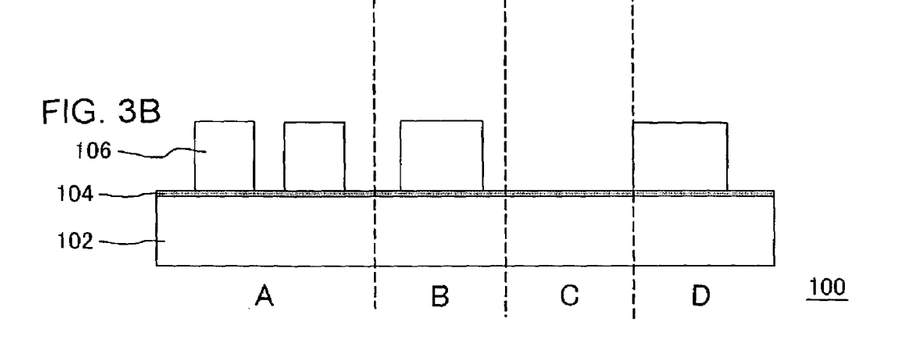

First, the gate oxide film 104 and the polysilicon film 106 (process target film) are formed on the semiconductor substrate 102. Next, the three-layered hard mask film 107, having the first film 108, the second film 110, and the third film 112 stacked therein in this order, is formed on the polysilicon film 106. The first film 108, the second film 110 and the third film 112 function as a hard mask. In this embodiment, the first film 108 is an amorphous carbon film.

The second film 110 and the third film 112 are composed of materials capable of ensuring etching selectivity therebetween. Examples of combinations of the second film 110 and the third film 112, expressed as third film 112/second film 110, include SiOx/Si, Si/SiOx, SiN/Si, Si/SiN, SiN/SiOx and SiOx/SiN. In these formulae, x expresses C, N, O or the like.

Figure 4A:
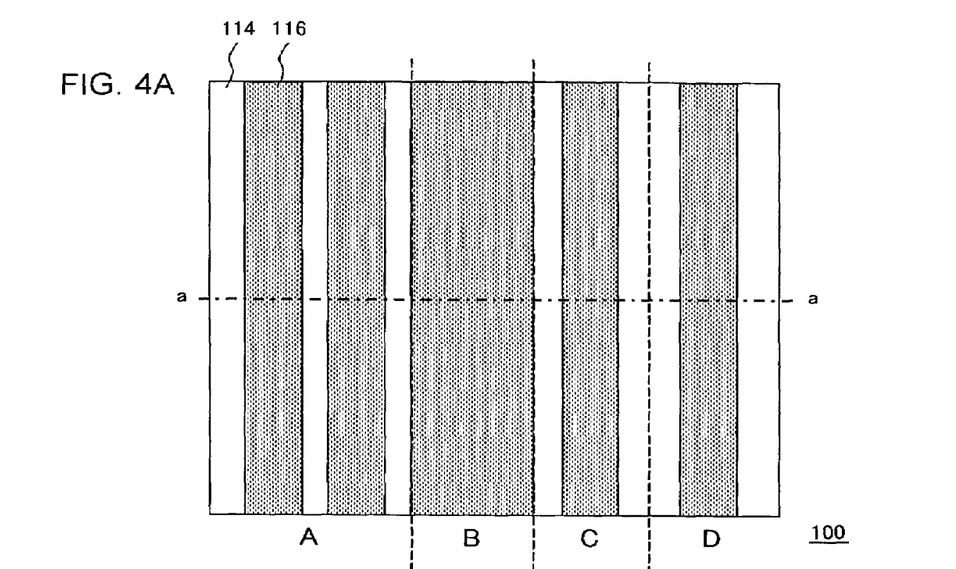
FIG. 4A and FIG. 4B are drawings explaining procedures of manufacturing a semiconductor device according to an embodiment of the present invention.
Figure 4B:
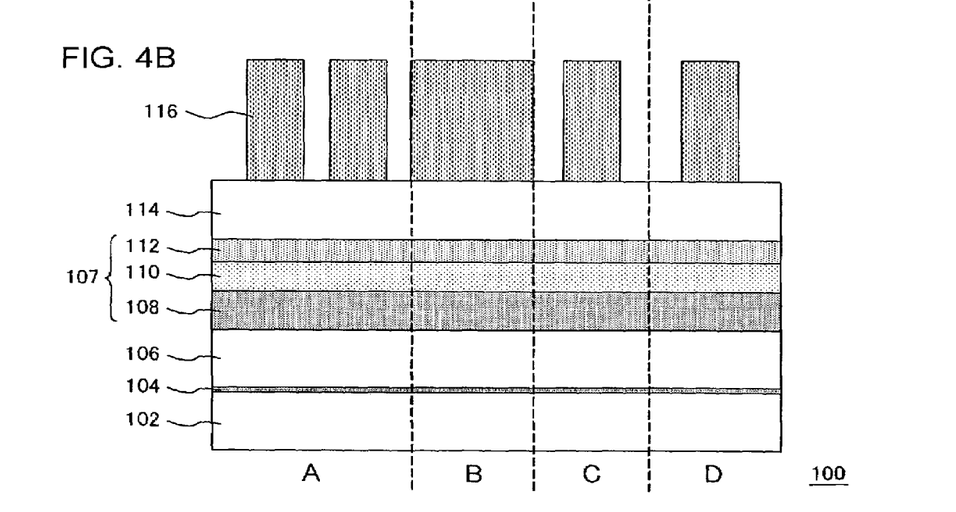

Subsequently, a first anti-reflection film 114 and a resist film are formed on the third film 112. The resist film is then illuminated through a Levenson-type PSM (not shown) having the narrow line patterns, followed by development, to thereby form a fine-pattern-forming resist film 116 (FIG. 4A and FIG. 4B). The narrow line patterns are used for forming the narrow line patterns having a small line dimension, and protect the portions where the narrow line patterns are formed. In this example, it protects also the entire surface of area "B".

Thereafter the first anti-reflection film 114 and the third film 112 are selectively dry-etched through the fine-pattern-forming resist film 116 used as a mask, while making use of the second film 110 as an etching stopper.

Figure 5A:
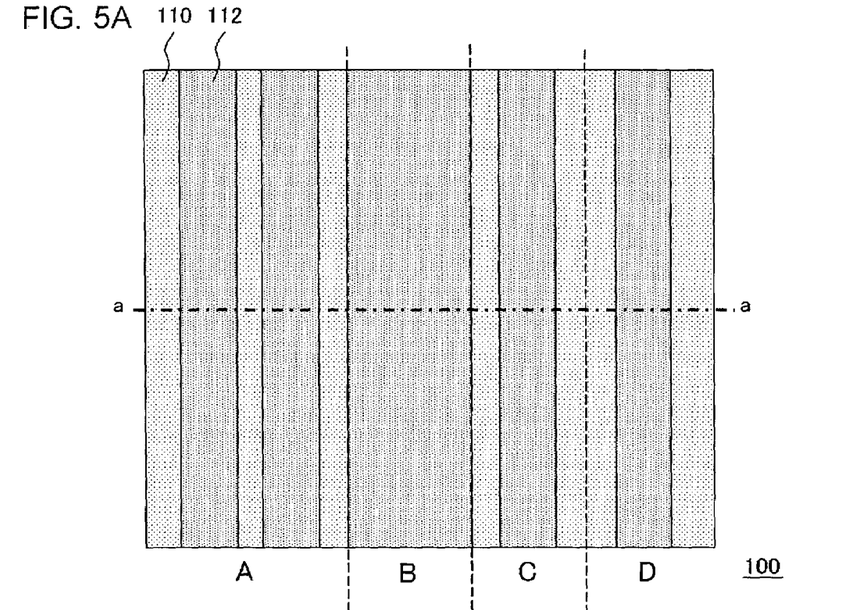
FIG. 5A and FIG. 5B are drawings explaining procedures of manufacturing a semiconductor device according to an embodiment of the present invention.
Figure 5B:
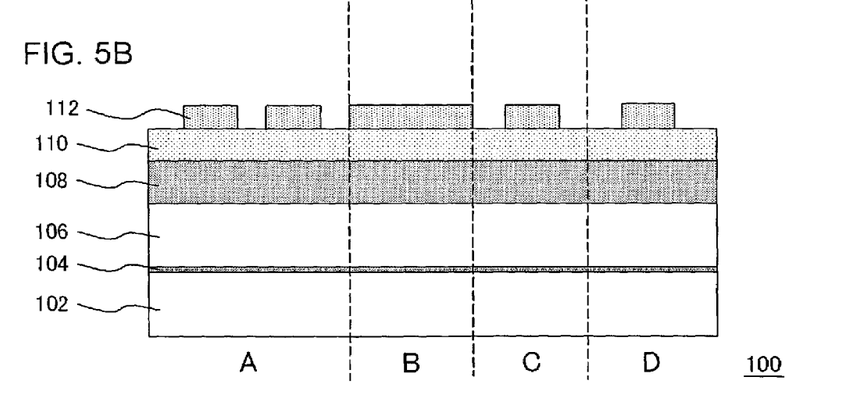

Thereafter, the fine-pattern-forming resist film 116 and the first anti-reflection film 114 are removed by ashing such as O2 plasma ashing. After the ashing, the surface of the semiconductor device 100 is cleaned using a chemical such as SPM. In this process, the first film 108 is protected by the second film 110, and will never be damaged by ashing nor the chemical. By these processes, the narrow line patterns are formed in the third film 112 (FIG. 5A and FIG. 5B). The third film 112 herein remain also on area "B".

Figure 6A:
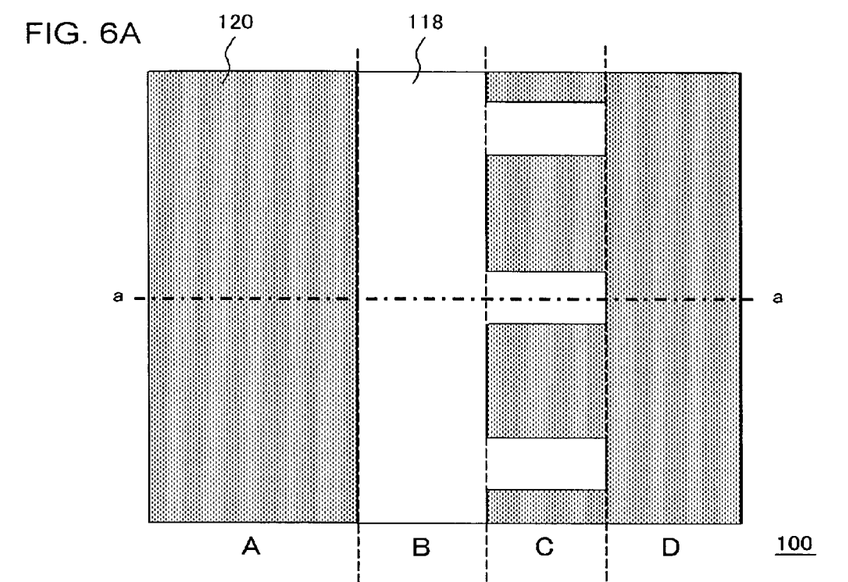
FIG. 6A and FIG. 6B are drawings explaining procedures of manufacturing a semiconductor device according to an embodiment of the present invention.
Figure 6B:
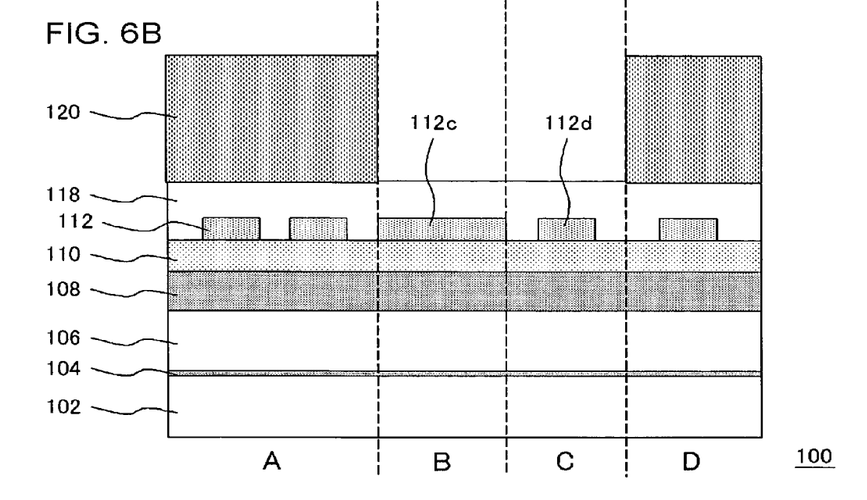

Subsequently, a second anti-reflection film 118 is formed on the second film 110 so as to bury the third film 112. A resist film is formed further on the second anti-reflection film 118. The resist film is then illuminated through a photomask (not shown) having a trimming pattern, followed by development, to thereby form a trimming resist film 120 having a trimming pattern (FIG. 6A and FIG. 6B). As shown in FIG. 6A, the trimming resist film 120 is opened in the discontinuous portions of the fourth line 106d. The trimming resist film 120 is also opened over the entire portion of area "B".

Subsequently, the third film 112 is selectively dry-etched through the trimming resist film 120 used as a mask, while making use of the second film 110 as an etching stopper.

Thereafter, the trimming resist film 120 and the second anti-reflection film 118 are removed by ashing such as $O_2$ plasma ashing. After the ashing, the surface of the semiconductor device 100 is cleaned using a chemical such as SPM. In this process, the first film 108 is protected by the second film 110, and will not be damaged by the ashing nor by the chemical.

Figure 7A:
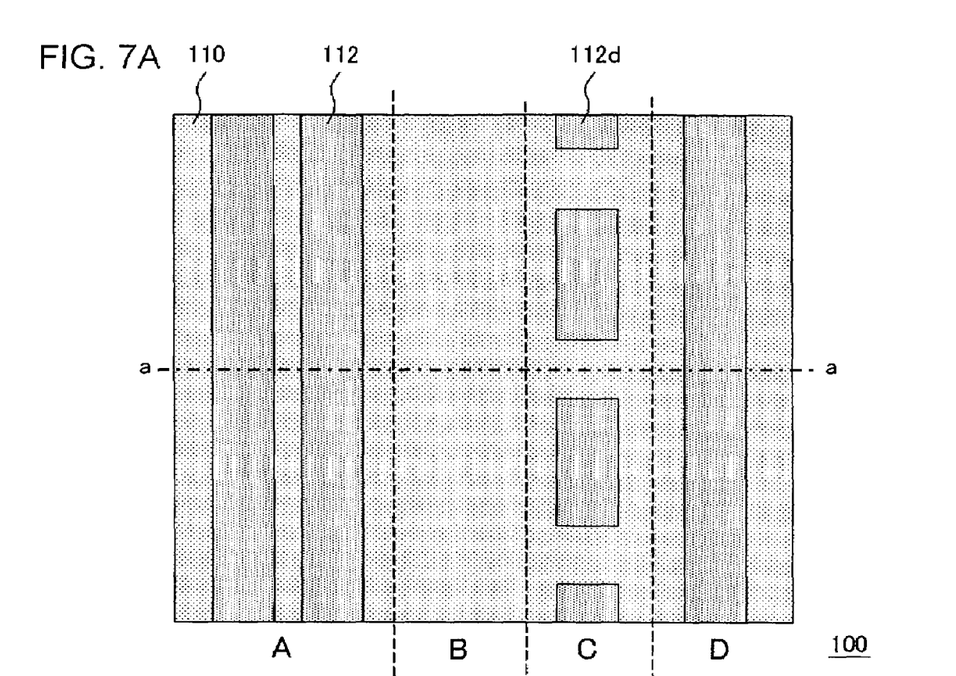
FIG. 7A and FIG. 7B are drawings explaining procedures of manufacturing a semiconductor device according to an embodiment of the present invention.
Figure 7B:
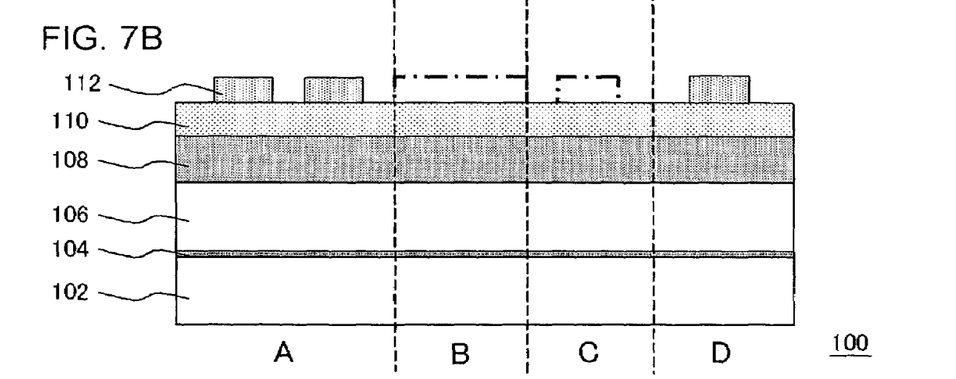

By these processes, a pattern corresponded to the fourth line 106d is formed in the third film 112, as being removed in a portion (discontinuous portion) of the narrow line patterns (FIG. 7A and FIG. 7B). In this process, also the third film 112 in area "B" is removed. More specifically as indicated by the dashed line in FIG. 7B, as viewed in a-a section in FIG. 7A, the third film 112 in area "B" and area "C" is removed.

Figure 8A:
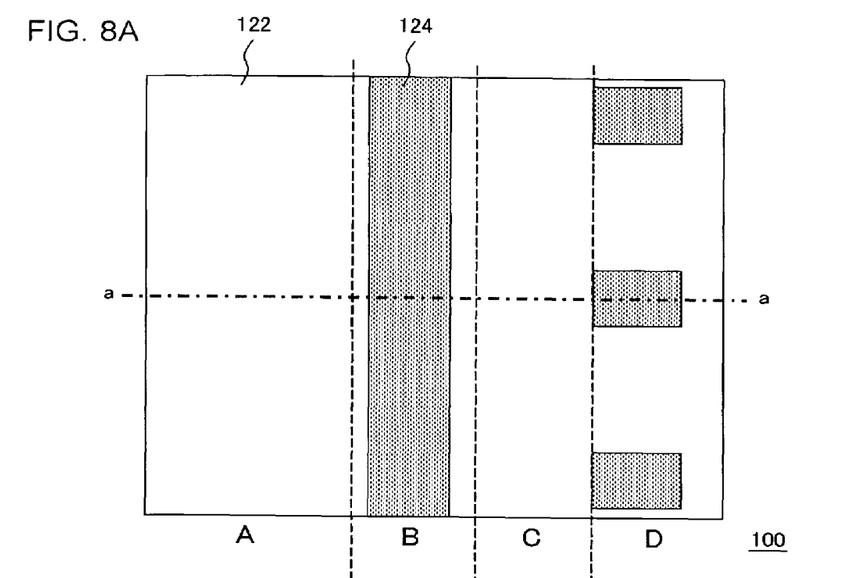
FIG. 8A and FIG. 8B are drawings explaining procedures of manufacturing a semiconductor device according to an embodiment of the present invention.
Figure 8B:
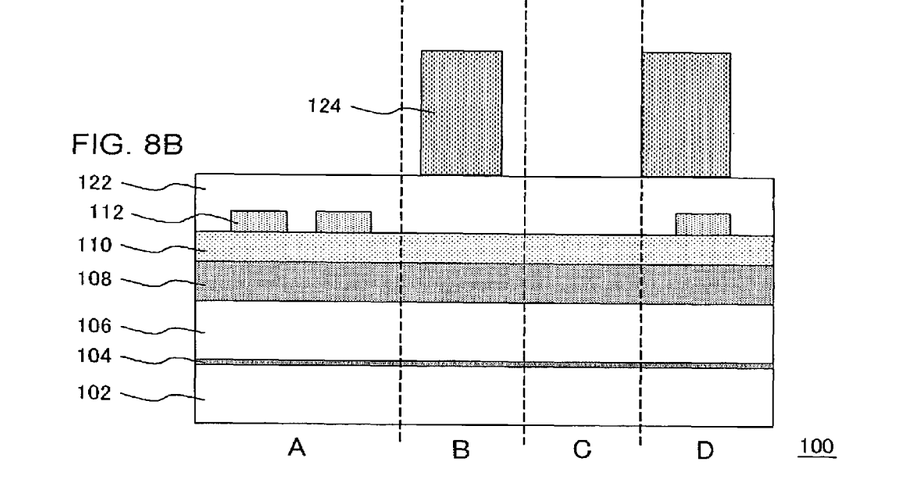
Figure 9A:
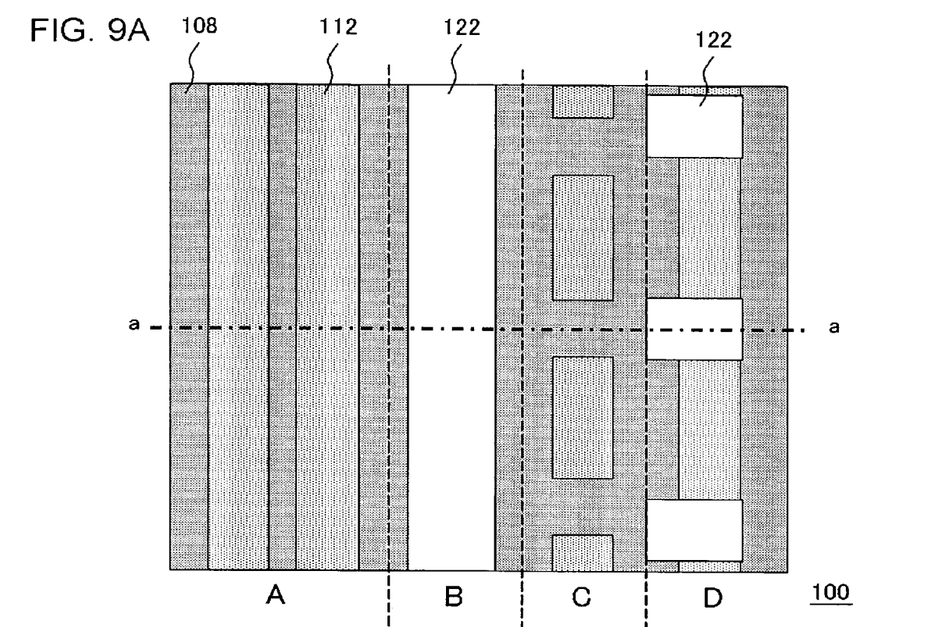
FIG. 9A and FIG. 9B are drawings explaining procedures of manufacturing a semiconductor device according to an embodiment of the present invention.
Figure 9B:
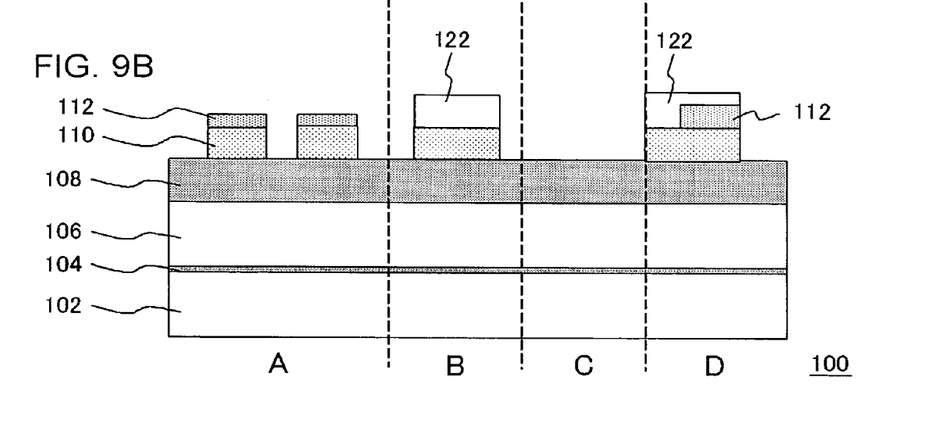
Figure 10A:
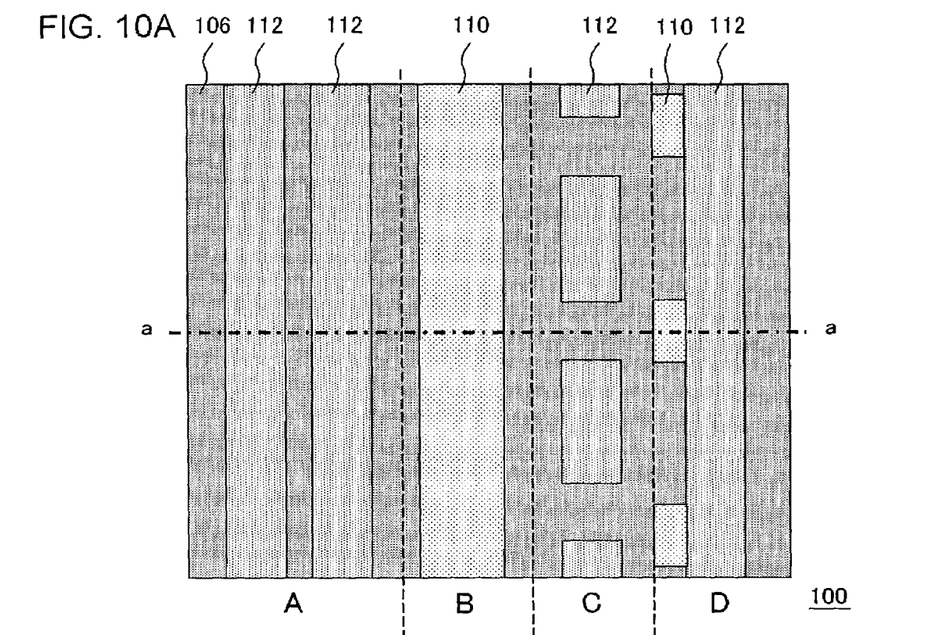
FIG. 10A and FIG. 10B are drawings explaining procedures of manufacturing a semiconductor device according to an embodiment of the present invention.
Figure 10B:
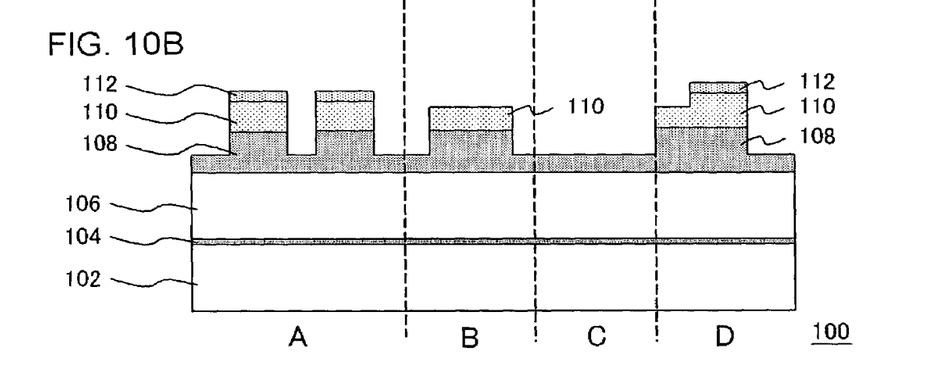

Subsequently, a third anti-reflection film 122 is formed on the second film 110 so as to bury the third film 112. A resist film is formed further on the third anti-reflection film 122, and the resist film is illuminated through a photomask (not shown) having a pattern containing the wide line patterns and the contact pads, followed by development, to thereby form a contact-forming resist film 124 (FIG. 8A and FIG. 8B). The pattern of the contact pads herein, in plan view, has regions which overlap or cross the narrow line patterns. This configuration can almost equalize the pattern width of the contact pads and the width of the wide line patterns, allowing highly accurate patterning.

Subsequently, dry etching is carried out through the contact-forming resist film 124 used as a mask. First, the third anti-reflection film 122 is etched, and thereby the third film 112 and the second film 110 are exposed. In this process, use of an etching gas showing a larger etchrate with respect to the second film 110 than to the third film 112 allows the third film 112 to function as a mask, so that the patterns of the third film 112 and the contact-forming resist film 125 are transferred to the second film 110. For an exemplary case where $SiO_2$/Si is used as the third film 112/second film 110, $HBr/O_2$ can be used as this sort of etching gas. For another exemplary case where $Si/SiO_2$ is used as the third film 112/second film 110, $CHF_2$ or $CHF_3$ can be used. Because also the second film 110 functions as the hard mask film in this embodiment, the pattern of the contact-forming resist film 124 can be reflected to the second film 110, and thereby the crossed pattern can be formed with a high accuracy.

In this etching process, also the contact-forming resist film 124, the third anti-reflection film 122, the third film 112, and the second film 110 are gradually etched. FIG. 9A and FIG. 9B, and FIG. 10A and FIG. 10B are drawings showing these states.

Figure 11A:
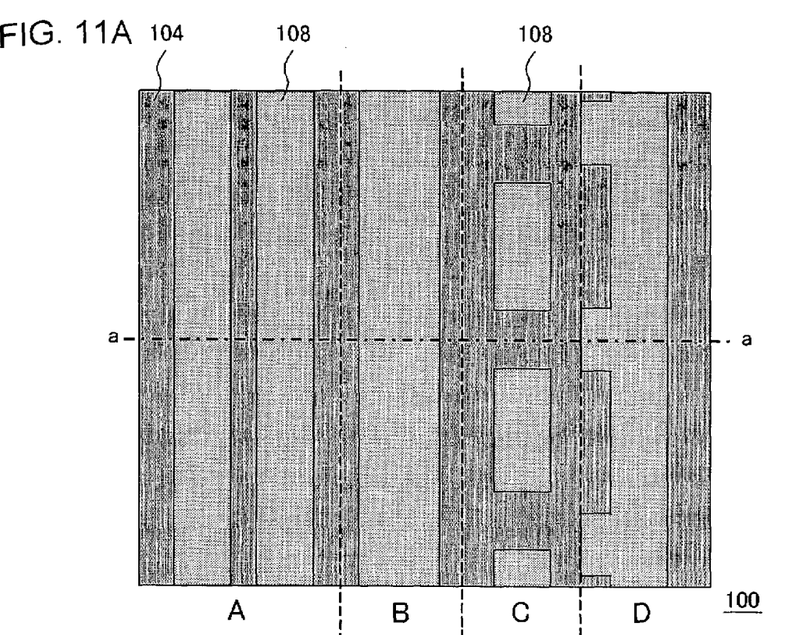
FIG. 11A and FIG. 11B are drawings explaining procedures of manufacturing a semiconductor device according to an embodiment of the present invention.
Figure 11B:
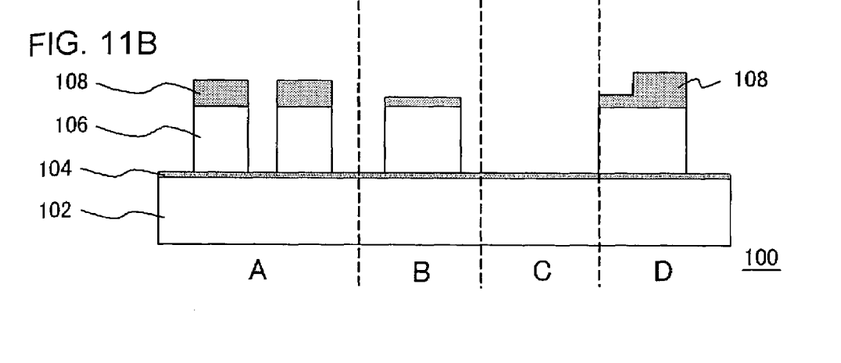

Thereafter, the first film 108 and the polysilicon film 106 are selectively etched in a sequential manner through the second film 110 used as the mask. By this process, the polysilicon film 106 is formed according to a desired pattern (FIG. 11A and FIG. 11B).

The polysilicon film 106 herein has the first film 108 remained thereon which is composed of an amorphous carbon film in this embodiment. The first film 108 can therefore be removed by ashing such as $O_2$ plasma ashing. Because the first film 108 can selectively be removed by ashing in this way, the gate oxide film 104 can be exempt from being damaged, making it possible to manufacture of semiconductor devices suppressed in degradation of characteristics such as gate leakage current and short-circuiting.

In particular for the case where a plurality of patterns overlap in a plan view as described in this embodiment, local difference in height occurs. As a consequence, an effort of removal-by-etching of the hard mask film locally remained directly on the polysilicon film 106, which is the process target film after being formed according to the predetermined pattern, may cause damages to the polysilicon film 106 in the exposed portions thereof. However, by composing the first film 108 with a material removable by ashing, the hard mask film can be removed without causing damage to the polysilicon film 106.

Thereafter, the process is followed by formation of diffusion layer and so forth by general methods, and thereby the semiconductor device containing elements such as transistors is manufactured.

The embodiment of the present invention having been described in the above referring to the attached drawings are merely examples of the present invention, allowing adoption of various configurations other than those described in the above.

For example, the above-described embodiment explained the case of forming the gate patterns, but the present invention is applicable to various patterns without special limitations when a plurality of resist films are used for the patterning. Besides the polysilicon film, the process target film may be metal film, silicide film, single crystal silicon film and silicon substrate, or may be an insulating film such as silicon nitride film or silicon oxide film. The first film was exemplified as an amorphous carbon film, whereas it may be any film so far as it can serve as a mask for processing the process target film, and can readily be removed by ashing without causing damage to the process target film, being exemplified by organic polymer films such as resist film and polyimide film, and inorganic carbon film and so forth, all of which being readily removable by ashing using oxygen-based gas.

The above-described embodiment showed an exemplary case where the Levenson-type PSM was used in the light exposure for forming the fine patterns, wherein the light exposure may be such as those using modified illumination such as dipole, or using a half-tone mask under general illumination conditions. Also second light exposure and third light exposure are not specifically limited, allowing any of light exposure using a Levenson-type PSM, light exposure based on modified illumination such as dipole, and light exposure using a half-tone mask under general illumination conditions. The fine patterns can be formed by using the Levenson-type PSM while the other illuminations can be performed by adopting general illumination conditions.

The above-described embodiment showed a configuration including (1) formation of the narrow line patterns, (2) removal of unnecessary portions of the narrow line patterns by trimming, and (3) formation of the wide line patterns and the contact pad patterns by light exposure repeated three times, whereas it is also allowable to adopt only (1) and (2), or only (1) and (3).

It is apparent that the present invention is not limited to the above embodiment, and may be modified and changed without departing from the scope and spirit of the invention.

What is claimed is:

1. A method of manufacturing a semiconductor device including a step of forming a predetermined pattern in a process target film formed on or over a semiconductor substrate, said method comprising:

a step of forming, on said process target film, a stacked hard mask film having a first film, a second film and a third film stacked therein in this order;

a step of selectively dry-etching said third film through a first resist film having a first pattern used as a mask, while making use of said second film as an etching stopper, to thereby form said first pattern in said third film;

a step of removing said first resist film;

a step of forming, after removal of said first resist film, a second resist film having a second pattern on said stacked hard mask film and then selectively dry-etching said stacked hard mask film and said process target film in this order, while making use of said second resist film as a mask, to thereby form said process target film into said predetermined pattern; and a step of removing, after formation of said process target film into said predetermined pattern, said first film remained on said process target film.

2. The method of manufacturing a semiconductor device as claimed in claim 1, wherein said step of forming said process target film into said predetermined pattern, through said second resist film used as a mask further comprises:

a step of selectively dry-etching said second film through said third film and said second resist film used as masks, to thereby form said second film into said predetermined pattern; and a step of selectively dry-etching said first film and said process target film in this order through said second film used as a mask, to thereby form said process target film into said predetermined pattern.

3. The method of manufacturing a semiconductor device as claimed in claim 1, further comprising, as being provided between said step of removing said first resist film and said step of forming said process target film into said predetermined pattern, a step of forming, on said stacked hard mask film, a third resist film having a third pattern for removing a part of said first pattern formed in said third film, and further selectively dry-etching said third film through said third resist film used as a mask, while making use of said second film as an etching stopper film; and a step of removing said third resist film.

4. The method of manufacturing a semiconductor device as claimed in claim 1, wherein said second pattern has a region overlapped with said first pattern in a plan view.

5. The method of manufacturing a semiconductor device as claimed in claim 1, wherein said first film is a carbon-base film.

6. The method of manufacturing a semiconductor device as claimed in claim 5, wherein, in said step of removing said first film, said first film is removed by ashing.

7. The method of manufacturing a semiconductor device as claimed in claim 1, wherein said first film is composed of an amorphous carbon.

8. The method of manufacturing a semiconductor device as claimed in claim 1, wherein said predetermined pattern includes a plurality of gate patterns.

9. The method of manufacturing a semiconductor device as claimed in claim 1, wherein said step of forming said first pattern in said third film further comprises:

a step of forming a resist film on said stacked hard mask film; and a step of forming said first resist film using a Levenson-type PSM having said first pattern.

* * * * *